(12) United States Patent
Konkola et al.

(10) Patent No.: US 6,316,849 B1
(45) Date of Patent: Nov. 13, 2001

(54) METHODS AND APPARATUS INVOLVING SELECTIVELY TAILORED ELECTROMAGNETIC FIELDS

(76) Inventors: Paul Konkola, 291 Windor St., #1, Cambridge, MA (US) 02139; David L. Trumper, 6 Katherine Way, Plaistow, NH (US) 03865

( * ) Notice: Subject to any disclaimer, the term of this patent is extended or adjusted under 35 U.S.C. 154(b) by 0 days.

(21) Appl. No.: 09/507,824

(22) Filed: Feb. 22, 2000

(51) Int. Cl.[7] ............................. B65G 49/07; H02K 41/00
(52) U.S. Cl. ............................................. 310/12; 414/935
(58) Field of Search ........................ 310/12, 13, 14; 33/1 M; 414/935

(56) References Cited

U.S. PATENT DOCUMENTS

| | | | |
|---|---|---|---|
| 5,196,745 | * 3/1993 | Trumpe | 310/12 |
| 5,699,621 | * 12/1997 | Trumper et al. | 33/1 M |
| 6,072,251 | * 6/2000 | Markle | 310/12 |
| 6,188,147 | * 2/2001 | Hazelton et al. | 310/12 |

* cited by examiner

*Primary Examiner*—Nestor Ramirez
*Assistant Examiner*—Judson H. Jones

(57) ABSTRACT

Method and apparatus are provided for selectively tailoring electromagnetic fields, and in particular for providing rapidly vanishing magnetic far-fields for magnet arrays, coils and the like. The method involves selectively combining magnetic, coil or other arrays having fields that vanish as $1/r^l$ to achieve and array having a selectively increase l value. Various techniques for achieving such combinations in one, two or three dimensions, and the arrays resulting from such combination are disclosed.

20 Claims, 9 Drawing Sheets

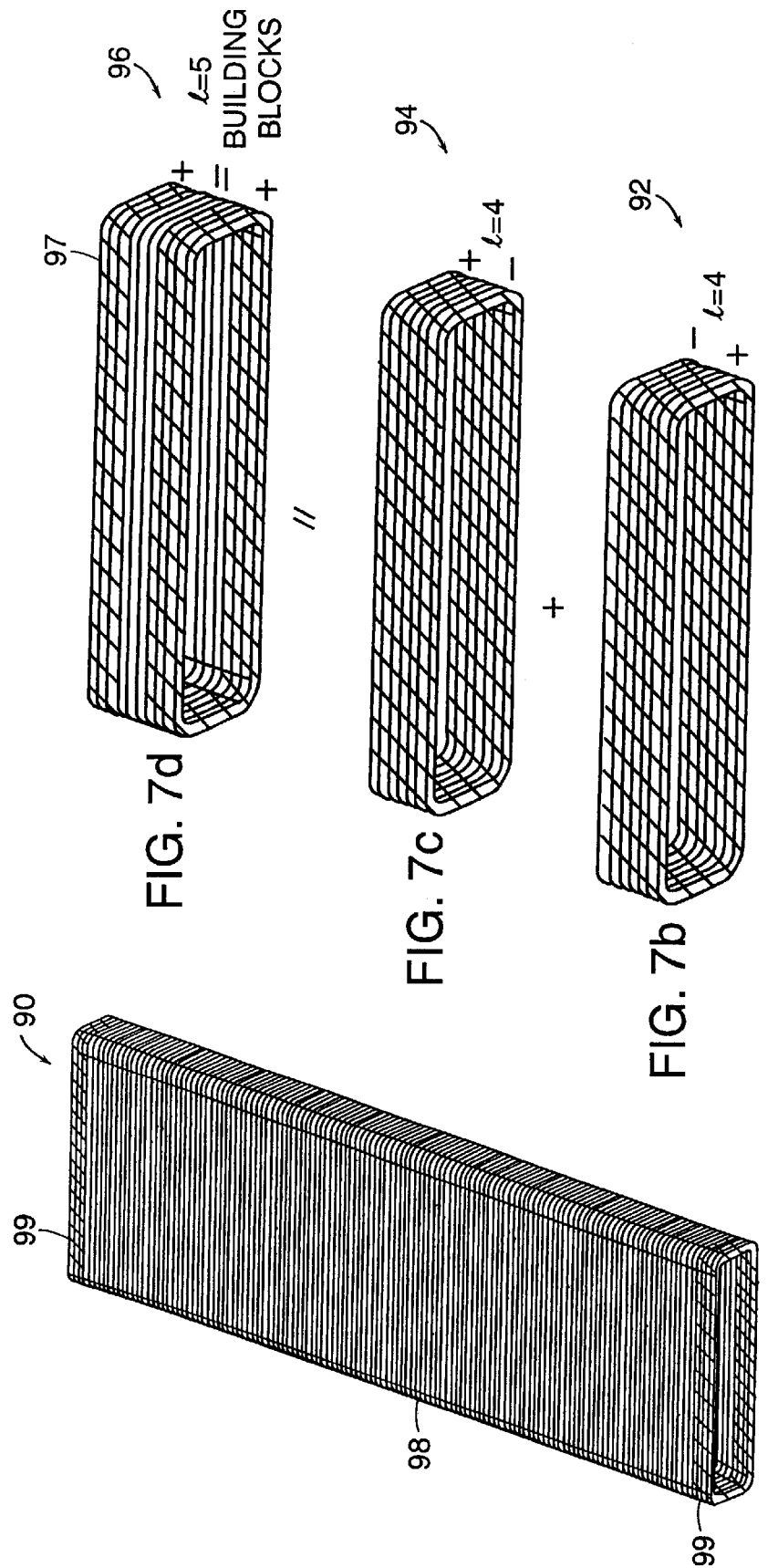

Figure 1A:
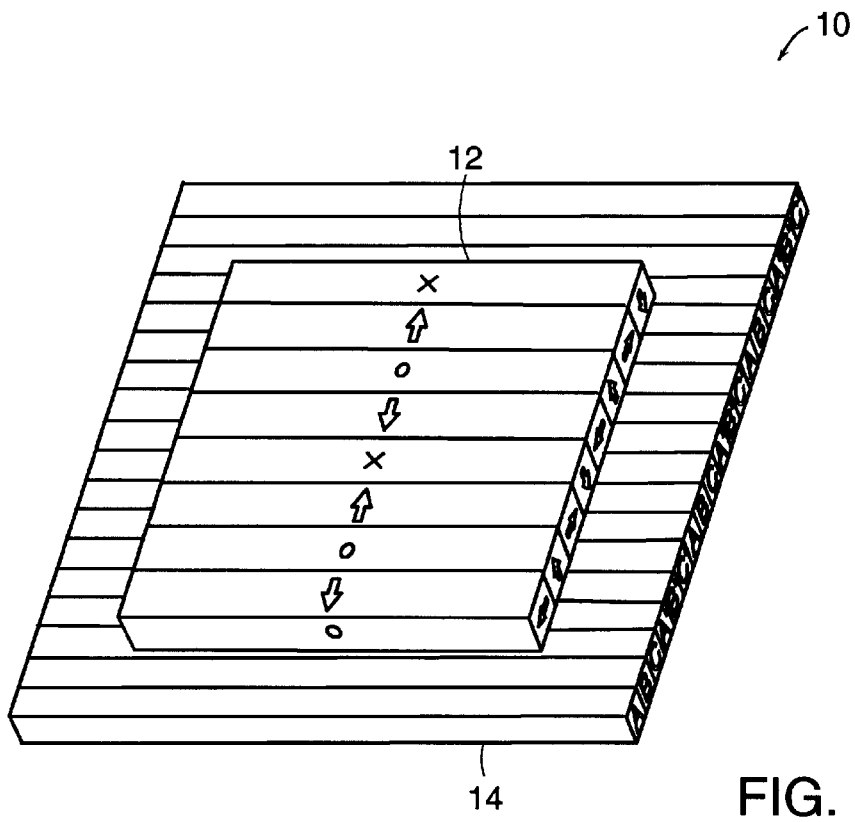

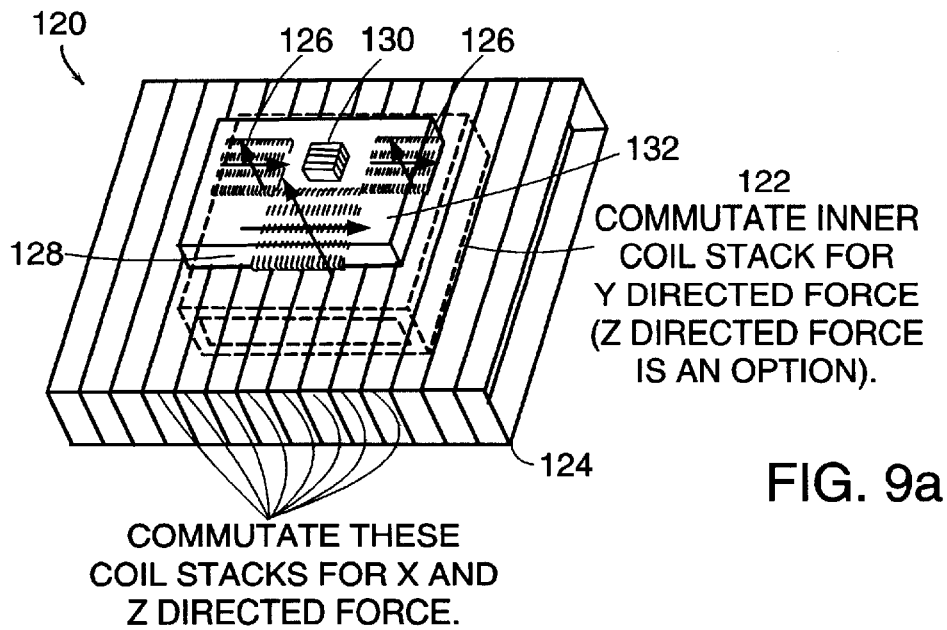
COMMUTATE THESE
COIL STACKS FOR X AND
Z DIRECTED FORCE.
FIG. 9a — COMMUTATE INNER COIL STACK FOR Y DIRECTED FORCE (Z DIRECTED FORCE IS AN OPTION).
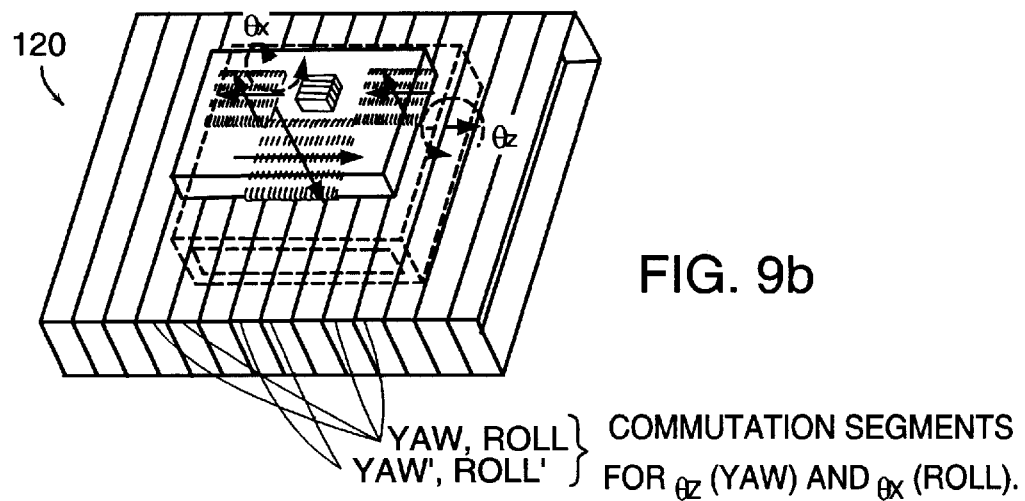
FIG. 9b
YAW, ROLL / YAW', ROLL' — COMMUTATION SEGMENTS FOR $\theta_z$ (YAW) AND $\theta_x$ (ROLL).
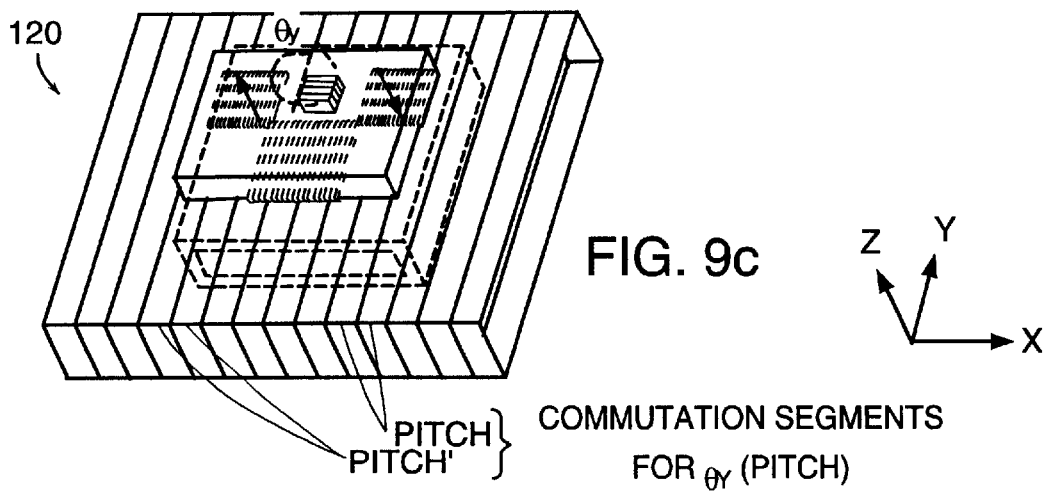
FIG. 9c
PITCH / PITCH' — COMMUTATION SEGMENTS FOR $\theta_Y$ (PITCH)
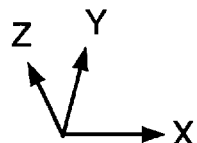

METHODS AND APPARATUS INVOLVING SELECTIVELY TAILORED ELECTROMAGNETIC FIELDS

FIELD OF INVENTION

This invention relates to tailoring of fields that can be linearly superpositioned and more particularly to the tailoring of far-fields. The invention also relates to arrays exhibiting such tailored far-fields, including magnetic arrays and coils. Such arrays and coils are particularly adapted for use in motors, providing rapidly vanishing magnetic far-fields so as to permit use of the motors in magnetically sensitive environments such as charged particle beam machines.

BACKGROUND OF THE INVENTION

There are many applications where a need exists to generate an electromagnetic field, for example a magnetic field, which is tailored to have a strong near field and a weak, rapidly vanishing far field. Such applications include scanning electron microscopes, various electron deflectors, magnetic bearing devices and magnetic positioners/electric motors; however, the primary current application for such electromagnetic fields is in electron beam lithography. According to the Semiconductor Industry Association in its National Technology Roadmap for Semiconductors, the required image placement accuracy for electron beam lithography production machines is projected to be 14 nm in the year 2003 and only 6 nm in the year 2012. As a result, electron beam stages will have to satisfy demanding requirements imposed on their placement accuracy, stray magnetic fields, thermal stability, and structural performance. Further, to reduce the time required to produce a chip, particularly a large chip which may include an array of 1,000×1,000 individual circuits, it is desirable that multiple electron guns be operating in parallel. However, with existing technology, there may be interaction between adjacent electron guns, severely limiting the number of guns which may be used in parallel. To complicate matters, the stages must also meet strict vacuum compatibility requirements since electron beam systems typically operate at high vacuum ($<10^{-6}$ Torr).

Recently developed motors with precise motion control and a single, magnetically levitated moving part possess several desirable features for application in state of the art lithography, as described in U.S. Pat. Nos. 5,699,621 and 5,196,745. A magnetic bearing stage can be mechanically simple, yet highly functional, providing movement with six degrees of freedom for a single moving part. Since the stage does not require precision bearing surfaces, which are susceptible to friction and backlash, positioning performance can be extended to the limits of control and metrology, and fabrication costs can be reduced. Also, disturbances that induce substrate vibrations can be controlled. For instance, use of a single moving part, as opposed to a plurality of moving parts, typically results in a structure with a higher natural frequency. Therefore, the stage is less sensitive to vibration and is more stable. Further, the stage has an increased travel speed and permits greater machine throughput. Since no lubrication is required and the suspended stage does not generate wear particles, a magnetic bearing stage is highly suited to both cleanroom and a vacuum environments. Magnetic bearing stages are highly reliable mechanical systems, an important system-level consideration for maintaining machine up-time. Additionally, stringent thermal stability requirements for the substrate can be accommodated since there is a gap between the stage and power dissipating components providing a large thermal resistance.

FIGS. 1(a) and (b) show the basic structure of such a prior art synchronous motor 10 with a magnetic bearing stage. The motor includes a Halbach magnet array 12 (see K. Halbach, Nuclear Instruments and Methods, vol. 169, 1980, p. 1–10 for an introduction to Halbach arrays) and a stator 14. Array 12 is a block array with four permanent magnets per period as designated by a magnetization rotation period. Stator 14 has six current phases, three which are designated A, B and C and three which flow in the reverse direction, respectively, and are designated A', B' and C'. One with ordinary skill in the art would recognize that other phases and/or magnet periods and/or magnets per period can be used and that electromagnets rather than permanent magnets can be used in the Halbach array. Strong forces are generated in the translation and suspension direction. Motion can be generated in the suspension and translation direction by varying the magnitude of the currents, and translations of array 12 relative to stator 14 can be generated by commuting the current phases in a sinusoidal manner. A small gap between the array 12 and the stator 14 serves to mechanically and thermally decouple these components.

Due to the aforementioned advantages, magnetic bearing stages provide a promising new alternative to stage technology currently being used in electron beam machines. However, charged particle motion is very sensitive to magnetic fields, and therefore, small uncontrolled changes in the magnetic fields experienced by the beam can cause significant and adverse deflections of the beam. For example, the magnitude of fringing fields must be less than 2 mGauss in order to keep Lorentz force deflections below 1 nm in a typical electron lithography beam. This poses a significant constraint on the magnetic fields that can be tolerated from the stage.

The magnetic field generated by a Halbach array of infinite extent decays exponentially with perpendicular distance from the surface due to efficient cancellation of the magnetic far-fields. In practice, however, Halbach arrays are always finite in size and, in fact, are preferably small in order to have a small footprint and mass. The magnetic field of an array with a finite extent decays more slowly than exponentially due to a lack of cancellation of the magnetic far-fields generated at ends of the array. The most rapidly vanishing magnetic field component generated by a Halbach array described in the prior art is quadrupole-like and decays as $1/r^4$, where r is distance from a point of observation to the array and is assumed to be large compared to the size of the array.

In order to incorporate a magnetic bearing stage into an electron beam machine, electromagnetic fields generated by the stator must also be small. Again, because of the finite size of practical stators, there is poor cancellation of the fields originating from ends of prior art stators. Generally, stators include current bearing coils, each of which acts as a magnetic dipole. Therefore, the magnetic fields of prior art stators appear dipole-like ($1/r^3$ drop off) or, at best, quadrupole-like ($1/r^4$ drop off) if the dipole-like contributions from the ends happen to cancel.

What has been said above for magnetic arrays and coils for use in drive motors for electron beam devices applies equally for other applications of magnetic arrays, coils or other electromagnetic field sources where strong near field and weak, rapidly vanishing far field requirements exist, and current technology can not provide better than quadrupole-like ($1/r^4$) drop-off. For example, electromagnets with rapidly decaying far fields would permit more dense packaging of electron guns without interference between adjacent guns, thus facilitating increased parallel generation on a chip, perhaps even permitting all circuits on a given chip to be simultaneously generated. Furthermore, current technologies provide no method to attenuate the fields of underlying quadrupoles.

A need, therefore, exists for a technique for attenuating far-fields generated by magnetic bearing stages, electron guns, or other magnetic or electromagnetic sources, in order to permit their use in magnetically/electromagnetically sensitive applications. Such applications include, but are not limited to, electron beam lithography. Magnetic bearing stages may also be used in other charged particle machines such as ion beam machines to hold samples for ion implantation or for characterization by secondary ion mass spectroscopy for instance. One with ordinary skill in the art will easily recognize the potential use of such a stage in other magnetically sensitive applications.

One potential method for attenuating magnetic fields is the use of shielding. However, incorporating magnetically permeable material onto a moving stage would result in undesirable uncontrolled distortions of stray fields which are likely to be present. For example, uncontrolled deflections of fields generated by magnetic lenses in the charged particle machines would correspondingly affect the charged particle motion. Alternatively, a stationary shield may be used between magnetic components and the beam. Holes in the stationary shield would allow structures supporting substrates, for instance, that are to be patterned by an electron beam on one side of the shield, to be attached to the moving stage located on the other side of the shield. The holes must be spaced far from the magnetic components in order to permit the shield to be effective. However, such a configuration also has several disadvantages including a large size which tends to produce a large footprint and poor dynamic properties.

Since space is expensive and is always at a premium in clean-room environments used for electron beam lithography semiconductor manufacture, any technique for reducing the size/footprint of various components of such a system is also desirable.

SUMMARY OF THE INVENTION

One aspect of the present invention is a method for tailoring fields so that they vanish as $1/r^l$, with l arbitrarily large, wherein the method involves iteratively canceling far-fields and thereby raising the value of l by one. In the method, an N'th field source, possessing an N'th moment and an N'th l value is combined with an M'th field source, possessing an M'th moment and an M'th l value to obtain a combination of field sources, wherein the N'th and M'th moments have substantially equal magnitudes and opposite signs, the N'th and m'th l values are equal, and the combination is an (N+1)'th field source possessing an (N+1)'th moment and an (N+1)'th l value that exceeds the N'th and M'th l values by one. This step is repeated until a combination with the desired l value is obtained. The method applies to any field that can be linearly superpositioned.

Another aspect of the present invention is a method for tailoring fields that can be linearly superpositioned so that they vanish as $1/r^l$ with l arbitrarily large, wherein the method involves canceling far-fields generated by p+1 sources with a given l value, thereby raising the value of l by p. The method is based on a scheme for superposing field sources whose strengths sum to cancel the coefficients of a binomial expansion.

Another aspect of the present invention is an electromagnetic component, for example a magnet array or a stator coil, and a method for making such a component, wherein the component has a tailored field that vanishes as $(1/r)^l$ with l arbitrarily large.

The structure and operation of the invention will be more readily understood from the detailed description which follows, which detailed description should be read in conjunction with the accompanying drawings.

BRIEF DESCRIPTION OF THE DRAWINGS IN THE DRAWINGS

FIGS. 1(a) and (b) are diagrammatic perspective and side views, respectively, of a prior art synchronous motor.

Figure 2:
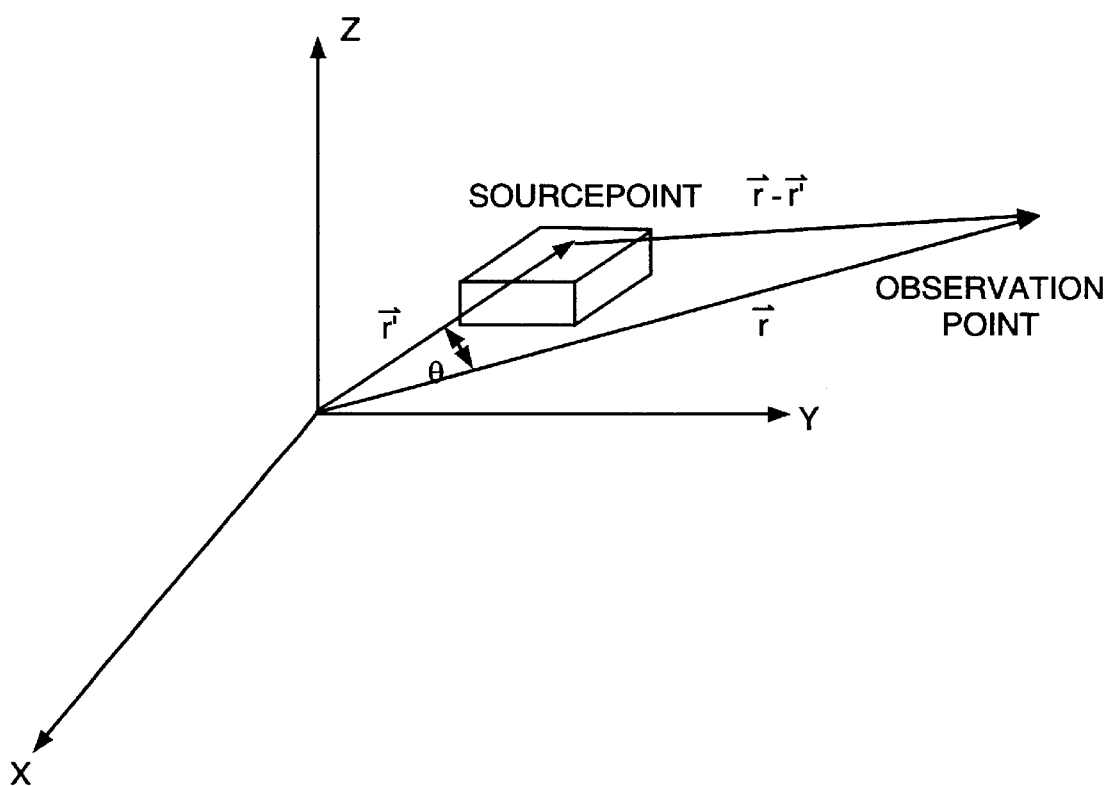

FIG. 2 is a diagram illustrating the spatial relationship between a current density source and an observation point.

FIGS. 3(a)–(h) are diagrammatic illustrations of a magnetic array subassembly and its components, wherein the magnetic array subassembly possesses magnetic far-fields that fall off as $1/r^5$.

FIGS. 4(a)–(f) are diagrammatic illustrations magnetic array subassemblies and their combination to achieve selected far field fall offs.

Figure 5C:
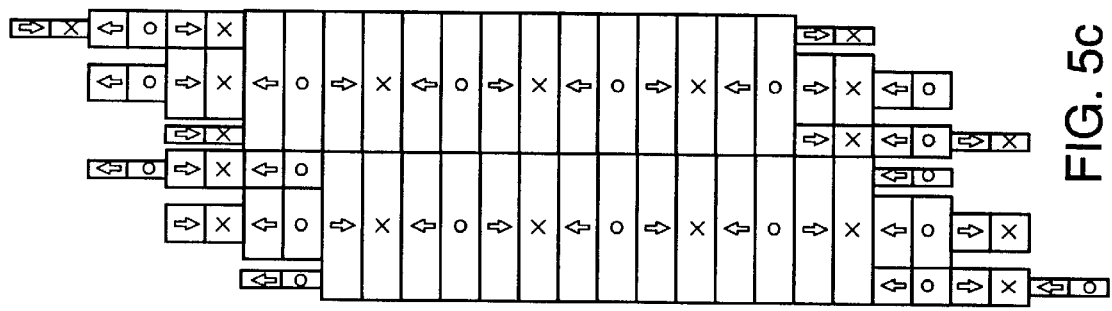
Figure 5B:
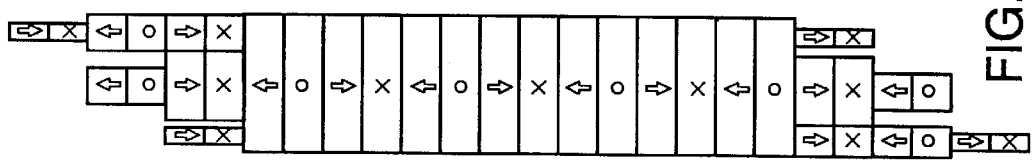
Figure 5A:
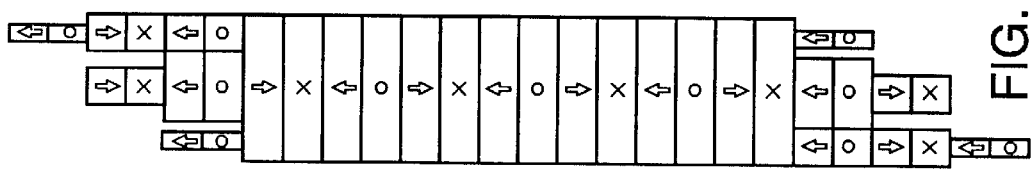

FIGS. 5(a)–(c) are diagrammatic illustrations of a magnetic array subassembly and their combination, wherein the magnetic array subassembly possesses magnetic far-fields that fall off as $1/r^7$ or $1/r^8$.

Figure 6C:
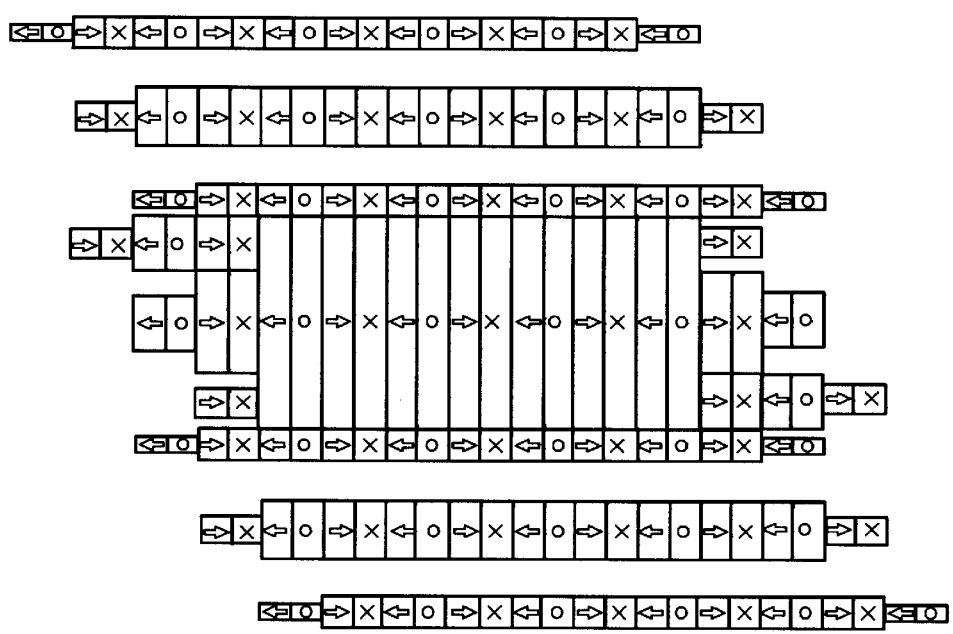
Figure 6B:
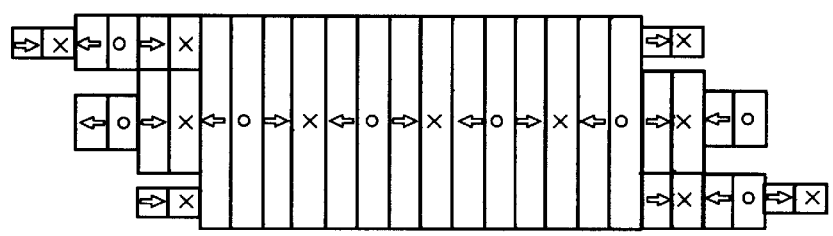
Figure 6A:
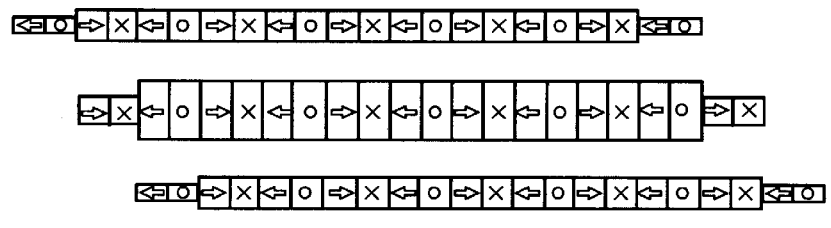

FIGS. 6(a)–(c) are diagrammatic illustrations of magnetic array subassemblies and the combination in an alternative manner to achieve far fields fall off as $1/r^7$ and $1/r^9$.

FIGS. 7(a)–(d) are diagrammatic illustrations of a stator and its components, wherein the stator possesses magnetic far-fields that fall off as $1/r^5$.

Figure 8A:
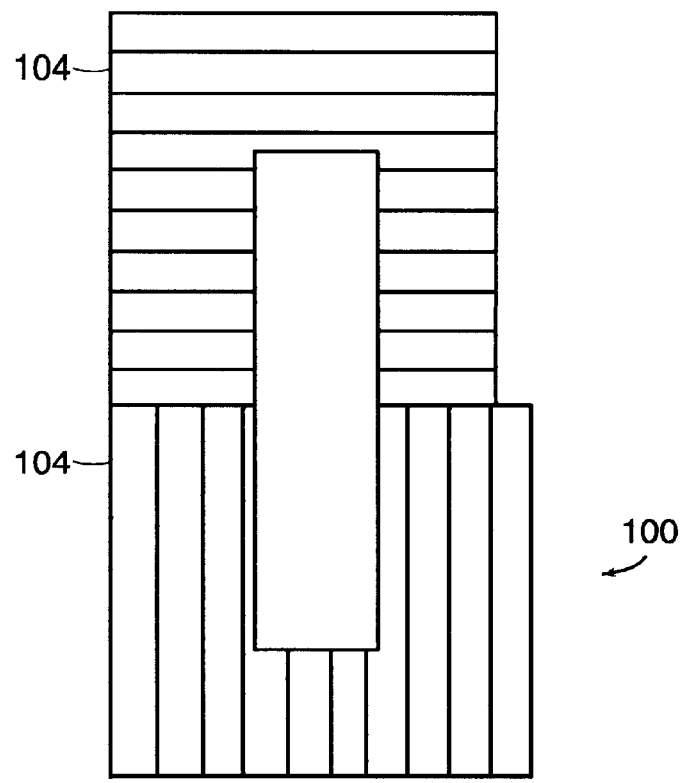

FIGS. 8(a) and (b) are diagrammatic illustrations of a stage capable of achieving 6-axis control using two arrays and two sets of coils.

FIGS. 9(a)–(c) are diagrammatic illustrations of a stage and forces therein yielding 6-axis control using inner and outer stators and four magnet arrays.

DETAILED DESCRIPTION

One aspect of the present invention is a method for tailoring fields so that they fall-off rapidly in the far-field; that is, fields are linearly superpositioned, whereby the superpositioned fields vanishes as $(1/r)^l$, l is an integer that is systematically increased, r is a distance from the field source to an observer and is assumed to be large compared to the size of the source. While preferred embodiments of the invention in which magnetic fields are tailored is discussed, it should be recognized that the method can also be applied to electric fields, and in general to any fields that can be linearly superpositioned.

Magnetic fields are created by charge currents (magnetic monopoles have been postulated theoretically but have never been observed to date). Given an arbitrary distribution of charge current densities, J(r'), a magnetic field, B(r), can be calculated by B(r)=∇× A(r); that is, the magnetic field is the curl of the vector potential, A(r)), where r' is a vector indicating the location of the current density sources over which we eventually integrate, r is a position vector of an observation point (see FIG. 2) and A(r) is given by:

$$A(r) = \int \frac{J(r')dr'}{r - r'} \qquad \text{Eq. (1)}$$

The current density may be due to an external source, such as current flowing through a wire, or a non-external source, such as a material with magnetization, M, the magnetic dipole moment per unit volume. In the latter case, the current density can be calculated by $J(r')=\nabla \times M(r')$ (that is, the current density is the curl of the magnetization). Due to the integral in Eq. 1, the magnetic field generated depends both on the strength of the magnetization and the volume of magnetic material.

Equation (1) exhibits the linear superposition principle. First, the vector potential depends linearly on the current source; if the current density could be expressed as a sum of two current densities, then the vector potential could be written as a corresponding sum; also, scaling the current density by an arbitrary factor results in a corresponding scaling of the vector potential. This follows immediately from Eq. (1) since integration is a linear operation. Second, the magnetic field also is obtained from the vector potential by a linear operation, namely the curl. Therefore, the field to be tailored depends linearly on the source generating the field. This is a very useful property since, for example, if one wanted to cancel a first magnetic field generated by a first source, one could simply add a second source with opposite sign, generating a second magnetic field that is oppositely directed to the first.

If the current density is localized on a length scale that is small compared to a distance to the observation point, the denominator of Eq. (1) can be expanded using a well known binomial expansion, and the vector potential is given by:

$$A(r) = \sum_{l=0}^{\infty} \frac{1}{r^{q+1}} \int r'^q J(r') P_q(\cos\theta) dr' \qquad \text{Eq. (2)}$$

In Eq. (2), Pq is a Legendre polynomial of order q, and cos θ is the angle between the position vector of an observation point, r, and a current density source, r'. Vector potential terms with q=0, 1, 2, . . . correspond to monopole, dipole, quadrupole, . . . fields, respectively, and vary as 1/r to the first, second, third, . . . power, respectively. The "strength" of a given q term depends on the value of the integral in equation 2 (known as magnetic moment) which in turn is a convolution of three factors: current density, $r'^q$ and Pq. Therefore, the smaller the current density or the more spatially compact the current density, the smaller the magnetic moment.

The magnetic field is obtained by taking the curl of the vector potential. Due to linearity of this operation, magnetic field q components are related to corresponding vector potential q components by the curl operation. It can be shown that the monopole term vanishes identically, reflecting the fact that magnetic monopoles have never been observed. It follows from equation 2 that, in the far-field (that is at distances that are large compared to the spatial extent of the current sources), the field is dominated by a pole with the smallest q value since contributions from poles with larger q values vanish more quickly with increasing r.

Figure 3:
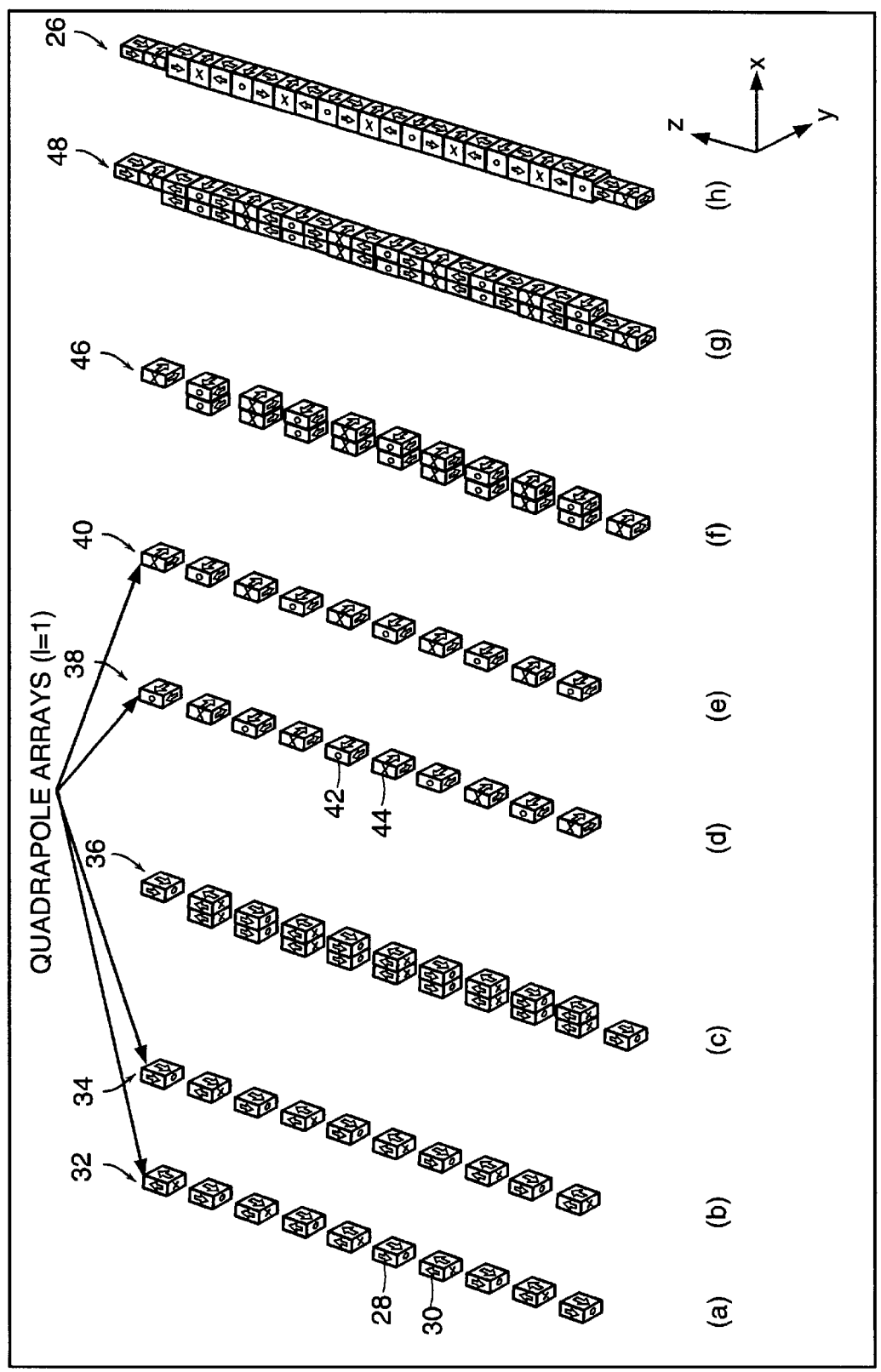

FIG. 3 shows a magnetic array subassembly 26 according to an illustrative embodiment of the invention. The basic building block shown is a quadrupole. Quadrupoles are formed by combining opposing parallel pairs of dipoles. As a result, the magnetic field generated by the dipoles tend to cancel each other, the dipole-like magnetic field terms vanishing in the far-field, and the quadrupole term becomes the dominating term. Although one dipole pair is sufficient to form a quadrupole, the number of dipole pairs per quadrupole array can be chosen so as to produce a force suitable to support a platen of a given mass; since each dipole pair has no dipole moment, the superposition of the pairs has no dipole moment either. Arrows associated with quadrupoles arrays in FIG. 3 reflect directions of constituent dipole arrays, in the sense that oppositely directed quadrupole arrays contain oppositely directed dipole arrays.

The dipoles are "combined" by bringing them close to each other compared to the length scale given by the distance to an observation point. In the limit that they are placed exactly on top of each other, the cancellation would appear perfect, even to a nearby observer. Alternatively, the quadrupoles may be viewed as being given for use in subsequent steps, without the aforementioned combining step. Similar comments regarding combining hold in subsequent steps discussed below.

Five +z dipole arrays 30 and five −z dipole arrays 28 are combined in an alternating fashion to form column 32 of FIG. 3(a). The number of arrays combined, their size and magnetic strength depend for a motor application on factors such as the travel required for the motor and the mass of the platen. Column 34 of FIG. 3(b) is combined in a similar manner. Column 34 is offset by one half the quadrupole array period, and columns 32 and 34 are combined to produce column 36 of FIG. 3(c). Arrays 42, 44 (±y) are rotated 90° from the corresponding arrays 28, 30 (±z). Five +y dipole arrays 44 and five −y dipole arrays 42 are combined in an alternating fashion in column 38 of FIG. 3(d) and column 40 of FIG. 3(e) is combined in a similar manner. Column 38 is offset by one half the quadrupole period, and columns 38 and 40 are combined to produce column 46 of FIG. 3(f). Finally, column 36 is offset by half a spatial period, and columns 36 and 46 are combined by interspersing arrays from the columns to produce column 48 of FIG. 3(g). The half spatial period offset corresponds to a magnetic near field that phase matches the currents in the stators of synchronous machines. Magnetic array subassembly 26 of FIG. 3(h) is approximately equivalent to column 48, with multiple adjacent quadrupoles being replaced by equivalent quadrupoles and quadrupoles at the ends slightly displaced.

In the embodiment of the invention shown, magnetic material is used to form the arrays. In this case, the strength of the magnetic field generated by a quadrupole array is proportional to the volume of magnetic material used. This is shown schematically in the diagram by letting the volumes of blocks represent magnitudes of the quadrupole moments. In other embodiments of the invention, the magnitude of the quadrupole moments may be controlled by factors other than the volume of the magnetic elements, and/or the magnetic fields may be generated by electromagnets.

Within a given column in FIG. 3, each quadrupole is paired with another quadrupole which has a quadrupole moment with an opposite sign and substantially the same magnitude. As a result, the quadrupole-like component in the far-field cancels, and the net quadrupole moment of each pair is zero. The pairs are then combined within each column yielding a superposition which also has zero quadrupole moment.

Columns 32 and 34 are combined to yield column 36 which has twice the area and hence essentially twice the magnetic near field strength of either columns 32 or 34. Columns 36 and 46 are combined in the manner shown to produce magnetic array subassembly 26. In the embodiment shown, the angle of rotation characterizing the direction of the quadrupole arrays is 90° between adjacent quadrupole arrays, but other angles are also possible. For example, if an angle of 180° is desired, then array 36 can be used without interspersing additional columns. Overall, the magnetic far-field of magnetic array subassembly 26 is octupole-like and drops off as $1/r^5$.

Figure 4:
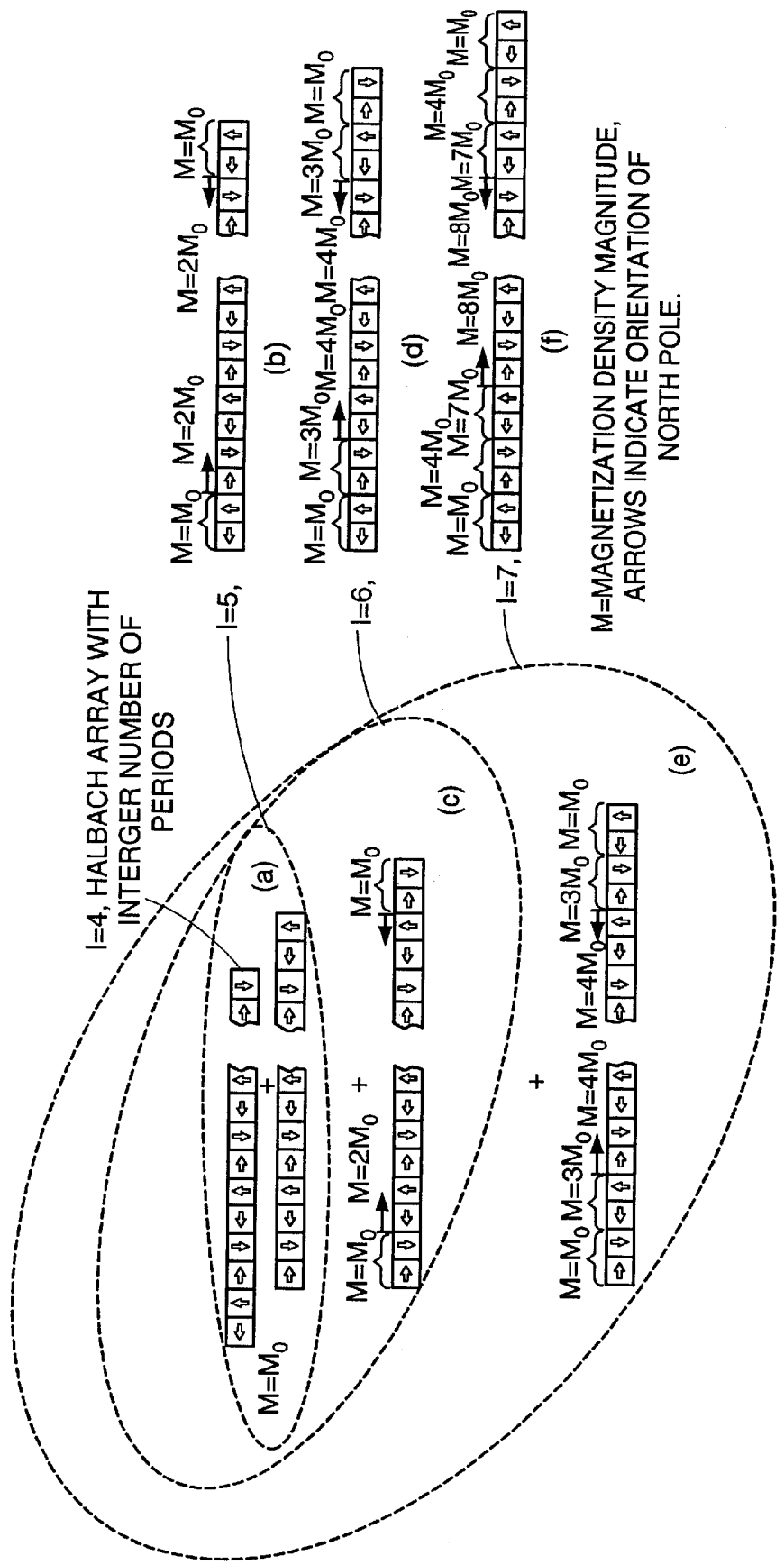

FIGS. 4(a)–(f) show the construction of arrays that are offset by multipole moment arms equal to half the spatial period. These arrays offer efficient far field cancellation for synchronous motor magnet and coil arrays because the length of the multipole moment arms are minimized. FIG. 4(a) depicts the combination of l=4 arrays to achieve the l=5 array of FIG. 4(b), FIG. 4(c) depicts the combinations of l=5 arrays to achieve the l=6 array of FIG. 4(d), and FIG. 4(e) depicts the combination of l=6 arrays to achieve the l=7 array of FIG. 4(f). FIGS. 4(b), (d) and (f) also show the relative magnetization for these arrays. The pattern shown could be continued for any desired l number, this pattern being repeated numerically in Table 1 which shows the relative magnetization on one side of arrays for l values up to 11. The unshown side of each array in Table 1 is the mirror image of the side shown. In practice, the absolute magnetization used to build an array is obtained from these relative values by scaling the maximum magnetization to be used to the maximum of the relative values pertaining to the desired l value. This scale factor is then applied to the other magnetization levels to obtain the absolute magnetizations of all levels. The sign of the magnetization must alternate with each half spatial period. The pattern evident from Table 1 is constructed by first obtaining the relative magnetization for the highest magnetization level for a given l number by multiplying by two times the remanence of the highest magnetization level of the l–1 array. The magnetization of the l=4 level is arbitrary and here it is set to 1. The lower magnetization levels for a given l value are calculated by adding the relative magnetization for the same magnetization level of the l–1 array. This technique could also be used for the highest magnetization level, remembering that the patterns repeats. The required number of half spatial periods having the last magnetization level is 2N for even l number and 2N+1 for odd l number. Here N, which is the number of half spatial periods, is an integer greater than or equal to 0. Thus, for the arrays of FIGS. 4(a)–(f), where the spatial period contains four magnets, the half spatial period contains two magnets. In this case there is one half spatial period at each end of each array. The pattern found in Table 1 is limited to arrays that have relative magnetization diminishing at the ends of the array but can have many half spatial periods with constant magnetization magnitude in the centers.

TABLE 1

| l number of array | 4 | 5 | 6 | 7 | 8 | 9 | 10 | 11 |
|---|---|---|---|---|---|---|---|---|
| Magnetization magnitudes on half spatial period segments, incrementing from end to end of array. | 1 | 1 | 1 | 1 | 1 | 1 | 1 | 1 |
| | | 2 | 3 | 4 | 5 | 6 | 7 | 8 |
| | | | 4 | 7 | 11 | 16 | 22 | 29 |
| | | | | 8 | 15 | 26 | 42 | 64 |
| | | | | | 16 | 31 | 57 | 99 |
| | | | | | | 32 | 63 | 120 |
| | | | | | | | 64 | 127 |
| | | | | | | | | 128 |

Another version of the invention uses the pattern shown in Table 2, which illustrates the least number of magnets to get each l level. Here the relative magnetization magnitudes are tabulated for every half spatial period from end to end of an array. The sign of the absolute magnetization must alternate with each half spatial period. The pattern evident from Table 2 is constructed by first assigning an equal but arbitrary magnetization to the ends of the array. In Table 2, 1 was arbitrarily chosen as the ends' magnetization. The intermediate magnetization levels for a given l value are calculated by adding the relative magnetization for the same magnetization level of the l–1 array and the next lowest magnetization level for l–1 array. The pattern of Table 2 uses the fewest possible number of half spatial period segments to achieve the l values.

Thus having described arrays with arbitrary l number that use the fewest possible spatial periods to any finite number of spatial periods, the invention also covers the summations of magnetization magnitudes of the arrays formed by superposition of the arrays cited.

TABLE 2

| l number of array | 3 | 4 | 5 | 6 | 7 | 8 | 9 | 10 |
|---|---|---|---|---|---|---|---|---|
| Magnetization magnitudes on half spatial period segments, incrementing from end to mid section of array. | 1 | 1 | 1 | 1 | 1 | 1 | 1 | 1 |
| | | 1 | 2 | 3 | 4 | 5 | 6 | 7 |
| | | | 1 | 3 | 6 | 10 | 15 | 21 |
| | | | | 1 | 4 | 10 | 20 | 35 |
| | | | | | 1 | 5 | 15 | 35 |
| | | | | | | 1 | 6 | 21 |
| | | | | | | | 1 | 7 |
| | | | | | | | | 1 |

The invention is not limited to field arrays that are arranged along a single axis, and may include, arrays arranged in a plane or in three dimensions. The planar arrangements use an identical technique as the coaxial technique when coordinate transformations are used to transform any two magnetic subelements onto a line. Moreover, a multipole does not necessarily need to be constructed of parallel opposing submultipoles separated by a vector that is coincident to multipole moment axes of the submultipoles. In one class of embodiments, the parallel opposing submultipoles lie at arbitrary locations in a plane. The submultipole moment can be transformed to a coordinate system with an axis that is coincident to the separation vector. The new coordinate system arranges the transformed submultipole moments along a line and therefore the cancellation techniques for submultipoles arranged along a single axis directly apply. The resulting multipole from the parallel opposing submultipoles is a higher order multipole with its multipole moment axis represented by the transformed coordinate system. In another class of embodiments, a three dimensional arrangement of submultipoles can be constructed where the combination of parallel opposing planar arrays yields an even higher order multipole. In this case, the submultipole moments of the individual planar arrays can be transformed to a coordinate system that is coincident to the separation vector of the planar arrays. The new coordinate system arranges the planar arrays along a line and therefore the cancellation techniques for submultipoles arranged along a single axis directly apply. Similarly, subelements can be transformed to a single axis and this transformation method is general to planar and three dimensional arrays of parallel opposing submultipoles. Additional subelements can be transformed to a new but solo line. This coordinate transformation approach is also general to three dimensional arrangements.

In FIGS. 5(a)–(c), l=7 magnetic array subassemblies of FIGS. 5(a) and 5(b), which arrays are identical but of opposite sense, are combined with a half spatial period offset to form an l=8 higher order magnet subassembly of FIG. 5(c). The l=7 arrays in FIGS. 5(a)–5(b) are formed by combination of three l=5 arrays of the form of magnet array 26. Here two arrays of opposite and half the multipole moment of a center array are combined as shown. Arrays with double the multipole moment of a given assembly can be obtained by doubling the dipole moment of all the dipoles in the given assembly, doubling of the dipole moments being obtained by using twice the volume of magnetic material with the same magnetization, or by using material with twice the magnetization. One with ordinary skill in the art recognizes that the dipole moment of a magnet is proportional to its magnetization density and the volume. Hence the dipole moment can be arbitrarily tailored by adjusting the product of the magnetization and the volume. When electromagnets are used, doubling of dipole moments can be achieved by doubling the number of constituent coil windings, by using twice as much current, or by doubling the area of the winding loops. In this manner, the magnetic strength of an array or stator can be scaled by any factor. In applying Tables 1 and 2 to the arrays of FIG. 5, the building blocks can be said to be the l=5 arrays. The relative magnetizations in Table 1 and 2 can apply to the relative multipole moments instead of the relative magnetization. In this case, a multipole is specified as the building block and new arrays with higher l numbers are formed by combination of these building blocks. The relative multipole moments of the combined building blocks are the same as given in Table 1 and 2.

Referring to FIG. 6, another construction method is shown that increases the l number by 2. FIG. 6(a) shows an l=7 array formed from the combination of l=5 arrays. The components are spaced to give half the multipole moment magnitude but opposite sense of the array in FIG. 6b. The combination of two of the subassemblies in FIG. 6(a) and one of the assemblies of FIG. 6(b) forms the array of FIG. 6(c), the arrays being combined as shown. Again, the various elements of the array may be spaced as shown in FIG. 6(c), may be combined to be juxtaposed with each other, or the array may be formed of magnets having equivalent magnetization to the combination shown in FIG. 6(c). The combination shown in FIG. 6(c) results in two additional levels of multipole cancellation, resulting in this assembly having l=9 as its lowest order multipole component.

The side-by-side methods used to create the magnet assemblies of FIGS. 5(c) and 6(c) can be applied recursively for higher order cancellation. Table 1 and Table 2 describe the magnitudes of the submultipole moments for this recursive superposition scheme but the resulting l number of the combined submultipoles becomes incremented by 1 over the l number of the submultipoles for each superposition. In the case of FIG. 5c, the method of forming this array is the superposition of the two l=7 arrays of FIGS. 5a and 5b. Here the building blocks are l=7 arrays of equal but opposite multipole moments. This is analogous to the case where two equal and opposite dipoles are combined to form a quadrupole (i.e. the +1, −1 column corresponding to l=4 in Table 1). For the case of FIG. 6c, the method of forming this array is the superposition of four l=7 building block arrays. The array of FIG. 6b includes two of these arrays superposed to give a multipole moment which is twice the moment magnitude but opposite that of the array of FIG. 6a. The array of FIG. 6c includes two arrays of FIG. 6a and the one array of FIG. 6b, which was formed for twice the multipole moment. The array of FIG. 6c has multipole moment magnitudes described by the +1, −2, +1 column corresponding to l=5 of Table 2. However, because the building block array for FIG. 6c is the l=7 array of FIG. 6a, the two levels of cancellation result in the array of FIG. 6c containing a dominant far-field multipole moment of l=9. More generally, the relative magnetizations in Table 1 and 2 apply now to the relative multipole moments instead of the relative magnetization when an arbitrary multipole is used as the building block. In this case, an arbitrary multipole is specified as the building block and new arrays with higher l numbers are formed by combination of these building blocks. The relative multipole moments of the combined building blocks required to achieve higher dominant l values are the same as given in Table 1 and 2. Such arrays, formed by supposition of arrays with multipole moment magnitudes given by the patterns in Tables 1 and 2, are within the contemplation of this invention.

Figure 1B:
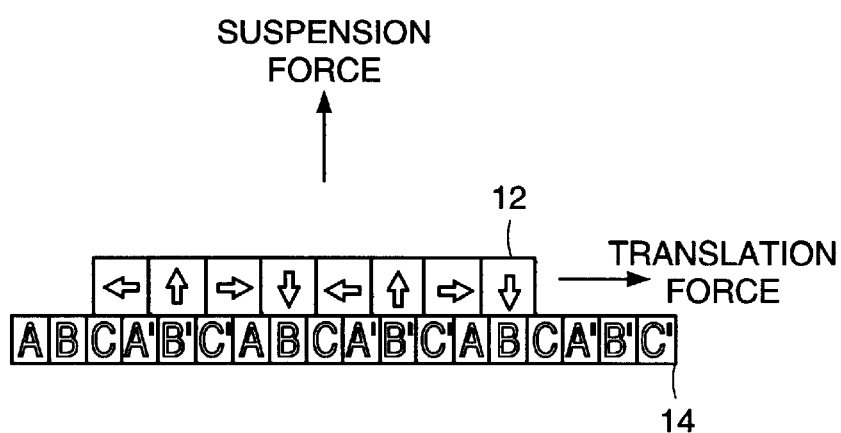

FIG. 7(a) illustrates stator 90, and FIGS. 7(b)–(d) illustrate stator coil sub-assemblies 92, 94 and 96, respectively, for one embodiment of the invention. Each three-phase stator sub-assembly 92, 94 has a spatial period consisting of six coils, the upper load bearing portions of the coils 92 being as shown in FIG. 1(b): A, B, and C representing currents with different phases, and A', B', and C' representing currents with the same respective phases as A, B, and C but flowing in the opposite directions. Currents in respective coils of stator sub-assembly 94 flow in opposite directions to those of subassembly 92 (i.e., A', B', C', A, B, C).

Stator coil sub-assemblies 92 and 94 are superposed with an offset of half a spatial period forming a stator building block 96; that is, if stator coil subassembly 92 has a first current pattern, ABCA'B'C', and stator coil sub-assemblies 94 has a second current pattern, A'B'C'ABC, then the respective A'B'C' coils are overlapped at 97. In FIGS. 7(a)–(d), coils which are overlapped are shown unhatched and have full current density, coils which are not overlapped having half current density and being shown as unhatched in the figures. The overlapping makes the stator coil assembly more compact and facilitates array motion. Stator 90 in the embodiment shown in FIG. 7(a) includes twenty-two stator building blocks 96; that is, 129 full current-density coils 98 and three half current-density coils 99 at each end.

Each coil in stator sub-assemblies 92 and 94 has a dipole-like magnetic far-field with a sense determined by the direction of current flow. Since each coil in stator sub-assemblies 92 and 94 is associated with another coil in the same stator sub-assembly possessing an opposite dipole sense, the dipole-like components of each stator sub-assembly 92 and 94 cancel in the far-field. The next highest nonvanishing contribution to the magnetic far-field is a quadrupole component. However, the quadrupole moments associated with sub-assemblies 92 and 94 also have opposite senses with respect to each other, and their superposition in stator building block 96 results in one further level of cancellation. As a result, building block 96 possesses an octupole-like far-field, and the magnetic field falls off as $1/r^5$.

In one embodiment of the invention, the combining of two multipole components with moments having substantially the same magnitude but opposite senses, results in one level of cancellation (+1,−1) and the value of l increases by one. This step can be repeated to increase l by an arbitrary integer. In another embodiment of the invention, the combining of three subassemblies, the first having a moment with a particular sense, the second having a moment with a magnitude that is twice as large as that of the first but a sense that is opposite to that of the first, and the third having the same moment and sense as those of the first, results in two levels of cancellation (+1, −2, +1). In this embodiment, the procedure of combining two subassemblies with moments having the same magnitude but opposite senses to obtain one level of cancellation is essentially automatically performed twice, and the value of l increases by two. The combining can be repeated to increase l by an arbitrary multiple of two and can be performed with steps of the aforementioned embodiment to increase l by an arbitrary number. In another embodiment, the combining of p+1 assemblies having magnetic moments whose strengths sum to cancel binomial coefficients given by an expansion of $(1-x)^p$ results in p levels of cancellation, and l increases by p. For example, if p=1, the coefficients are +1,−1, and if p=2, the coefficients are +1, −2, +1, two cases that have been discuss above. More generally, the pattern of multipole moment magnitudes shown in Tables 1 and 2 describes the combination of subarrays, whether they be composed of coils, permanent magnets, or electromagnets, to achieve any arbitrary l number.

Figure 8B:
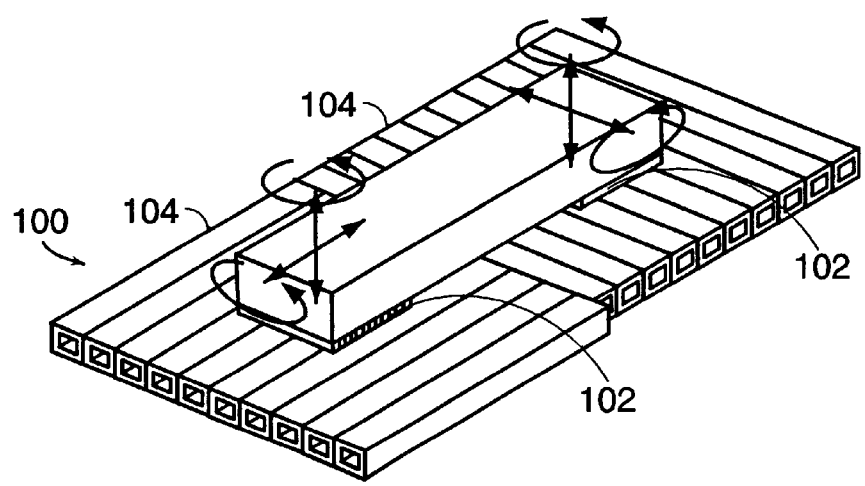

Arrays and stators with tailored fields can also be used in various magnetic bearing stage configurations, for example, the configuration 100 shown in FIG. 8. This configuration includes two magnetic arrays 102 fixed to the underside of a platten 103 and two sets of coils 104. Each set of coils contains stacks of coils juxtapositioned. The coils can be commutated along the stack and across the stacks to achieve forces to control 6 degrees of freedom. Forces and torques designated by arrows in the figures can generate 6-dimensional motion (3-dimensional rotations and 3-dimensional translations).

Another design 120 capable of achieving 6-dimensional motion is shown in FIGS. 9(a)–(c). This novel embodiment includes an inner stator 122 buried within an outer stator 124 and four arrays (two small x-z force arrays 126, one large x-z force array 128 and a y-z force array 130) mounted to a moving platten 132. Outer stator 124 produces x- and z-directed forces, and inner stator 122 produces y- and z-directed forces. The x-directed forces associated with small x-z force arrays 126 may oppose the x-directed force of large x-z force array 128 to produce a yaw torque (FIG. 9b). Additionally, the z-directed forces of small x-z force arrays 126 may oppose the z-directed force of large x-z force array 128 to produce a roll torque (FIG. 9b). The z-directed forces of the small x-z force arrays 126 may oppose each other to produce a pitch torque (FIG. 9c). The arrays are independently commutable. The large air gap through which inner stator 122 operates reduces the efficiency of this actuator. However, control effort in this direction is small if scanning is to be performed in the x direction and if substantially all of the suspension of platten 132 is provided by outer stator 124. Larger spatial period magnet and coil arrays may be utilized for motors involving inner stator 122 to increase its efficiency.

The length of each element of the stator stacks 122 and 124 is a half integer multiple of the magnet spatial period, and smaller than half the length of the smallest magnet array, so that the degrees of freedom can be easily decoupled, each magnet array being over at least one coil stack that is not shared with adjacent arrays nor overlapping their ends. For the embodiment shown, in the outer stator, all the stacks beneath the stage are commutated synchronously to produce x-directed and z-directed force. Conversely, the inner stator is a single coil stage and commutates to produce y directed force and, if desired, may also provide some suspension force. The manner in which pitch, roll and yaw are obtained has been indicated above. In designing the stages of FIGS. 9(a)14 9(c), it is important that the width of the magnet arrays acting on the inner and outer stators be integral multiples of the orthogonal stator's spatial period in order to prevent y force and x force coupling between the orthogonal magnet arrays and stators. For instance, the width of the x-z force arrays, where width is the dimension in the y direction, should be an integral multiple of the y-z stator's spatial period. Conversely, the width of the y-z force arrays, where width is the dimension in the x direction, should be an integral multiple of the x-z stator's spatial period. This design 120 is advantageous in that it can provide a footprint which is the travel, plus the sum of the magnet lengths for each side. This provides substantially minimum footprint for a given platten 132.

While in the discussion above, the far field cancellation techniques of this invention have been utilized with permanent magnet and electromagnet arrays, the invention may also find application for far field cancellation with other many electromagnetic field generating components, including magnetic and electrostatic bearings and actuators, magnetic and electrostatic lenses and deflectors, transformers, and, in general, electromagnetic devices whose fields are undesirable to the operation of sensitive devices that are in a substantially close proximity. Further, while the invention has been discussed in connection with applications involving bearing and/or drive stages, particularly for lithography applications, the invention may also be employed in other applications, including electron guns and columns for lithography or other applications where there is a desire to operate a plurality of such guns and columns in close proximity to each other substantially simultaneously, in connection with electron microscopes, and in other electron beam deflection applications. Other possible stage configurations are disclosed in U.S. Pat. Nos. 5,699,621 and 5,196,745. Thus, while the invention has been described above with respect to exemplary embodiments and the principles of operation and implementation, it will be readily apparent to those skilled in the art that the foregoing and other alterations and improvements are possible, as well as completely different embodiments, without departing from the spirit and scope of the invention which is to be limited only by the appended claims.

What is claimed is:

1. A method for tailoring electromagnetic fields such that the field has a smallest l value equal to l' and greater than two, including the steps of:

(a) combining an N'th field source, possessing an N'th moment and an N'th l value less than l', with an M'th field source, possessing an M'th moment and an M'th l value less than l', to obtain a combination of field sources, wherein the N'th and M'th moments have substantially equal magnitudes and opposite signs, the N'th and M'th l values are equal, and the combination is an (N+1)'th field source possessing an (N+1)'th moment and an (N+1)'th l value that exceeds the N'th and M'th l values by one; and (b) comparing the (N+1)'th l value with l' and, if the (N+1)'th l value is less than l', incrementing N and M by one and repeating steps (a) and (b).

2. The method of claim 1, wherein the field is a magnetic field.

3. The method of claim 2, wherein the field sources are magnet arrays.

4. The method of claim 3, wherein the magnet arrays include subcomponents which generate magnetic subfields possessing a direction, the direction for magnetic subfields of adjacent subcomponents being different.

5. The method of claim 4, wherein the step of combining further includes the step of aligning the magnetic arrays to be combined, the step of aligning including the step of orienting and positioning the magnetic arrays so that a maximum number of subcomponents with parallel magnetic subfields are cancelled.

6. The method of claim 2, wherein the field sources include at least one of permanent magnets and electromagnets.

7. The method of claim 6, wherein the magnetic field is generated by a stator.

8. A method for increasing the smallest l value, l', of a field by a non-negative integer, p, including combining (p+1) field sources, each possessing a first, second, third, . . . (p+1)'th respective moment and each possessing an l value of l' to obtain a combination of field sources possessing an l value of l'+p, wherein the respective (p+1) moments sum to cancel binomial coefficients given by an expansion of $(1-x)^p$.

9. An electromagnetic device generating a magnetic far-field such that the magnetic far-field has an l value of l', where l' is greater than two, including:

parallel opposing field sources, wherein the magnetic moments of the field sources sum to cancel binomial coefficients given by an expansion of $(1-x)^p$ and p is a non-negative integer.

10. A device as claimed in claim 9 wherein said device is one of a magnetic bearing stage, a magnetic actuator, lens, or deflector and an electrostatic actuator, lens or deflector.

11. The device stage of claim 9, wherein the field sources are magnet arrays.

12. The device of claim 11, wherein the magnet arrays include subcomponents which generate magnetic subfields possessing a direction, the direction for magnetic subfields of adjacent subcomponents being different.

13. The device of claim 12, wherein a maximum number of subcomponents with parallel magnetic subfields are canceled.

14. The device of claim 11, wherein the magnetic arrays include at least one of permanent magnets and electromagnets.

15. The device of claim 14, wherein the magnetic field is generated by a stator.

16. A positioning system for providing precise positioning of a stage in three linear and three rotary dimensions, with long travel in two linear dimensions comprising:

an inner stator substantially enclosed within an outer stator, with the inner stator having a substantially orthogonal current flow compared to the outer stator;

a plurality of magnetic arrays for producing forces in one of said long travel linear dimensions and in the suspension direction;

at least one magnet array for producing forces in the orthogonal linear dimension; and a means of commutating the inner and outer stators to produce controllable forces in three linear and three rotary dimensions.

17. A magnetic array tailored to exhibit increase l values, and thus decreased magnetic far-fields, including a plurality of magnetic subarrays each having an l level $\geq 4$, said subarrays being arranged with magnetization levels as indicated in Table 1, where the magnetization level for each subarray is 1 in the table.

18. The magnetic array of claim 17 wherein said array is one of a planar array and a three dimensional array of said subarrays.

19. A magnetic array tailored to exhibit increased l values, and thus decreased magnetic far-fields, including a plurality of magnetic subarrays each having an l level $\geq 4$, said subarrays being arranged with magnetization levels as indicated in Table 2, where the magnetization level for each subarray is 1 in the table.

20. The magnetic array of claim 19 wherein said array is one of a planar array and a three dimensional array of said subarrays.

* * * * *